US010942295B2

(12) United States Patent
Miyamoto et al.

(10) Patent No.: US 10,942,295 B2
(45) Date of Patent: Mar. 9, 2021

(54) REFLECTION PREVENTING FILM AND METHOD FOR MANUFACTURING SAME, AND REFLECTION PREVENTING LAYER-ATTACHED POLARIZATION PLATE

(71) Applicant: NITTO DENKO CORPORATION, Ibaraki (JP)

(72) Inventors: Kodai Miyamoto, Ibaraki (JP); Minoru Kanatani, Ibaraki (JP); Tomotake Nashiki, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/309,256

(22) PCT Filed: Jun. 16, 2017

(86) PCT No.: PCT/JP2017/022267
§ 371 (c)(1),
(2) Date: Dec. 12, 2018

(87) PCT Pub. No.: WO2017/217526
PCT Pub. Date: Dec. 21, 2017

(65) Prior Publication Data
US 2019/0310394 A1 Oct. 10, 2019

(30) Foreign Application Priority Data

Jun. 17, 2016 (JP) .................................. 2016-120947
Jun. 15, 2017 (JP) .................................. 2017-117666

(51) Int. Cl.
*G02B 1/115* (2015.01)
*G02B 1/14* (2015.01)
(Continued)

(52) U.S. Cl.
CPC .............. *G02B 1/115* (2013.01); *B32B 7/023* (2019.01); *B32B 27/08* (2013.01); *B32B 27/306* (2013.01);
(Continued)

(58) Field of Classification Search
CPC ....... B32B 7/023; B32B 27/08; B32B 27/306; B32B 27/308; B32B 2255/10;
(Continued)

(56) References Cited

U.S. PATENT DOCUMENTS 7,548,290 B1 * 6/2009 Kitamura ............. G02B 5/3033
349/117
2009/0052041 A1 2/2009 Watanabe et al.
2016/0245956 A1 8/2016 Kodama

FOREIGN PATENT DOCUMENTS

JP 2002-189211 A 7/2002
JP 2004-53797 A 2/2004
(Continued)

OTHER PUBLICATIONS

Translation of JP2004354828A (including bib and description). (Year: 2004).*
(Continued)

*Primary Examiner* — Catherine A. Simone
(74) *Attorney, Agent, or Firm* — Westerman, Hattori, Daniels & Adrian, LLP

(57) ABSTRACT

The anti-reflection film includes an anti-reflection layer composed of multilayer thin-films having different refractive indexes on one principal surface of a transparent film substrate. The moisture permeability of the anti-reflection film is 15 to 1000 g/m²·24 h. The surface of the anti-reflection layer has an indentation elastic modulus of 20 to 100 GPa, and an arithmetic mean roughness Ra of 3 nm or less. The arithmetic mean roughness Ra of the surface of the
(Continued)

anti-reflection layer is preferably 1.5 nm or less. The thin-films constituting the anti-reflection layer can be deposited by, for example, a sputtering method.

15 Claims, 2 Drawing Sheets

(51) Int. Cl.
  *B32B 7/023* (2019.01)
  *B32B 27/08* (2006.01)
  *B32B 27/30* (2006.01)
  *C23C 14/00* (2006.01)
  *C23C 14/35* (2006.01)
  *G02B 5/30* (2006.01)
  *G02B 1/18* (2015.01)
  *C23C 14/08* (2006.01)

(52) U.S. Cl.
  CPC ........ *B32B 27/308* (2013.01); *C23C 14/0036* (2013.01); *C23C 14/08* (2013.01); *C23C 14/352* (2013.01); *G02B 1/14* (2015.01); *G02B 1/18* (2015.01); *B32B 2255/10* (2013.01); *B32B 2255/20* (2013.01); *B32B 2255/26* (2013.01); *B32B 2307/412* (2013.01); *G02B 5/3025* (2013.01)

(58) Field of Classification Search
  CPC ............ B32B 2255/20; B32B 2255/26; B32B 2307/412; G02B 1/115; G02B 1/14; G02B 1/18; G02B 5/3025; C23C 14/0036; C23C 14/08; C23C 14/352
  See application file for complete search history.

(56) References Cited

FOREIGN PATENT DOCUMENTS

| JP | 2006-220906 A | 8/2006 |
| JP | 2008-233667 A | 10/2008 |
| JP | 2008-268328 A | 11/2008 |
| JP | 2009-47876 A | 3/2009 |
| JP | 2009-109850 A | 5/2009 |
| JP | 2009-282219 A | 12/2009 |
| JP | 2013-178534 A | 9/2013 |
| JP | 2016-156995 A | 9/2016 |

OTHER PUBLICATIONS

Notification of Transmittal of Translation of the International Preliminary Report on Patentability (Form PCT/IB/338) issued in counterpart International Application No. PCT/JP2017/022267 dated Dec. 27, 2018, with Forms PCT/IB/373 and PCT/ISA/237. (11 pages).

International Search Report dated Sep. 12, 2017, issued in counterpart International Application No. PCT/JP2017/022267 (2 pages).

Office Action dated Jan. 8, 2019, issued in counterpart Japanese Application No. 2017-117666, with English machine translation. (11 pages).

Office Actoin dated Jul. 10, 2020, issued in counterpart CN Application No. 201780037625.7, with English translation (15 pages).

Office Action dated Oct. 28, 2020, issued in counterpart TW Application No. 106120134, with English translation (7 pages).

* cited by examiner

| | Initial | After 1000 hours |
|---|---|---|
| Example 1 |  |  |
| Example 2 |  |  |
| Example 3 |  |  |
| Comparative Example 1 |  |  |

REFLECTION PREVENTING FILM AND METHOD FOR MANUFACTURING SAME, AND REFLECTION PREVENTING LAYER-ATTACHED POLARIZATION PLATE

TECHNICAL FIELD

The present invention relates to an anti-reflection film including an anti-reflection layer composed of multilayer thin-films on a transparent film, and a manufacturing method thereof.

BACKGROUND ART

Anti-reflection films are used on the viewing-side surfaces of image display devices such as liquid crystal displays and organic EL displays, for purposes such as the prevention of image quality degradation due to reflection of external light or image reflection, and the improvement of contrast. The anti-reflection film includes, on a transparent film, an anti-reflection layer composed of a stack of multiple thin-films having different refractive indexes.

Embodiments of the anti-reflection film include an anti-reflection layer-equipped polarizing plate. The anti-reflection layer-equipped polarizing plate is formed by bonding the anti-reflection film to the surface of a polarizing plate or bonding the anti-reflection film as a protective film to the surface of a polarizer. In addition, a method is also known in which the anti-reflection layer-equipped polarizing plate is formed by depositing an anti-reflection layer on a polarizing plate.

Patent Document 1 discloses that disposing an anti-reflection film, which also serves as a water vapor barrier layer, on a transparent plastic substrate can suppresses warpage of a polarizing plate in a heated and humidified atmosphere, thereby enhancing the reliability, when the anti-reflection film including an anti-reflection layer with a moisture permeability of 10 $g/m^2 \cdot 24$ h or less is used.

PRIOR ART DOCUMENT

Patent Document

Patent Document 1: JP 2002-189211A

SUMMARY OF THE INVENTION

Problems to be Solved by the Invention

In general, polarizing plates for vehicle image display devices are required to be less likely to change in characteristics at a higher temperature e.g., 90° C. or higher (having excellent high-temperature durability), as compared with polarizing plates for mobile devices assumed to be used outdoors. In a case where the anti-reflection film in Patent Document 1 or the like is used, moisture ingress and the like from the outside are suppressed, thus the moisture resistance of the polarizing plate is improved. On the other hand, it was found that the polarizing plate provided with the anti-reflection film in Patent Document 1 is likely to generate unevenness in the polarizing plate when exposed to a high-temperature environment for a long period of time, and fail to satisfy the high-temperature reliability required for in-vehicle applications.

In view of the foregoing, an object of the present invention is to provide an anti-reflection film which is excellent in high temperature durability when bended to a polarizer.

Means for Solving the Problems

An anti-reflection film according to the present invention includes an anti-reflection layer composed of multilayer thin-films having different refractive indexes on one principal surface of a transparent film substrate, and has a moisture permeability of 15 to 1000 $g/m^2 \cdot 24$ h. The indentation elastic modulus of the anti-reflection layer surface is 20 to 100 GPa, and the arithmetic mean roughness Ra thereof is 3 nm or less, and preferably 1.5 nm or less.

The transparent film substrate preferably includes a hard coat layer on the anti-reflection layer forming surface. The hard coat layer preferably includes an acrylic urethane resin. The hard coat layer may be an anti-glare hard coat layer with fine particles dispersed in a resin matrix. An antifouling layer may be disposed on the surface of the anti-reflection layer.

The anti-reflection layer is preferably an alternative stack of a high refractive index layer and a low refractive index layer. A niobium oxide thin-film is preferred as the high refractive index layer, and a silicon oxide thin-film is preferred as the low refractive index layer.

An anti-reflection layer-equipped polarizing plate according to the present invention includes the anti-reflection film mentioned above on one surface of a polarizer.

Furthermore, the present invention relates to a method for manufacturing the above-mentioned anti-reflection film according to the present invention. The thin-films constituting the anti-reflection layer are preferably formed by a sputtering method, and reactive sputtering is particularly preferred. In the reactive sputtering, deposition is carried out while introducing an inert gas and a reactive gas into a deposition chamber. It is preferable to control the introduction amount of the reactive gas such that the deposition by the reactive sputtering is performed in a transition region. Examples of the controlling methods include: a method of sensing the plasma emission intensity of discharge and controlling the introduction amount of the reactive gas introduced into a deposition chamber based on the plasma emission intensity; and a method of sensing the discharge voltage during sputtering and controlling the introduction amount of the reactive gas such that the discharge voltage is constant. The pressure at the time of sputtering deposition is preferably 0.4 Pa or higher. The magnetic flux density at a target surface at the time of sputtering deposition is preferably 20 mT or higher.

Effects of the Invention

Because the anti-reflection layer is high in moisture permeability, the anti-reflection film according to the present invention is excellent in durability at high temperature in a case where an anti-reflection layer-equipped polarizing plate is prepared. In addition, because the anti-reflection layer has high mechanical strength and a smooth surface, the anti-reflection film also has excellent scratch resistance and fingerprint wiping-off property.

MODE FOR CARRYING OUT THE INVENTION

[Configuration of Anti-Reflection Film]

Figure 1:
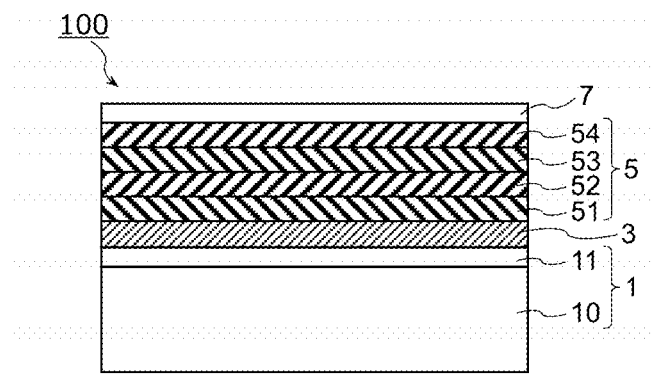
FIG. 1 is a cross-sectional view schematically illustrating an embodiment of an anti-reflection film.
Figure 2:
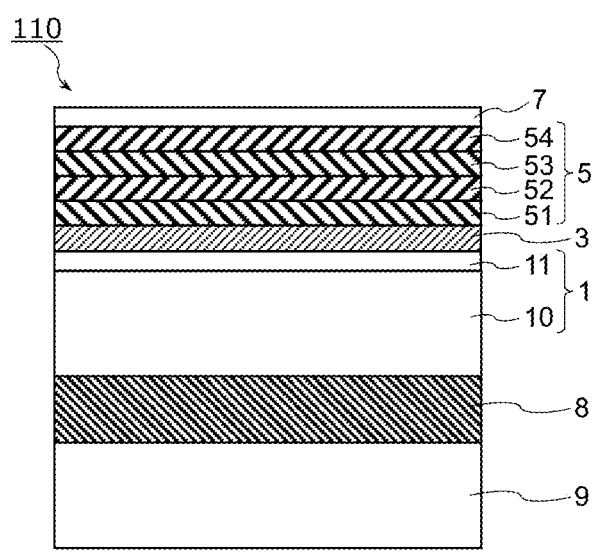
FIG. 2 is a cross-sectional view schematically illustrating an embodiment of a polarizing plate provided with an anti-reflection layer.

FIG. 1 is a cross-sectional view schematically illustrating the configuration of an anti-reflection film according to an embodiment. FIG. 2 is a cross-sectional view schematically illustrating an embodiment of an anti-reflection layer-equipped polarizing plate in which an anti-reflection film is bonded to one surface of a polarizer 8.

The anti-reflection film 100 in FIG. 1 has an anti-reflection layer 5 disposed on a transparent film substrate 1 with an adhesion improvement layer 3 interposed therebetween. The anti-reflection layer is a stack of two or more thin-films, and shown in FIG. 1 is the anti-reflection layer 5 composed of a stack of four layers of thin-films 51, 52, 53, and 54.

<Transparent Film Substrate>

The transparent film substrate 1 includes a flexible transparent film 10. A hard coat layer 11 is preferably disposed on the transparent film 10 at a side where the anti-reflection layer 5 is formed.

(Transparent Film)

The visible light transmittance of the transparent film 10 is preferably 80% or higher, more preferably 90% or higher. Although the thickness of the transparent film 10 is not particularly limited, the thickness is preferably approximately 5 to 300 μm, more preferably 10 to 300 μm, further preferably 20 to 200 μm from the viewpoints of workability such as strength and handling ability, and thin layer property and the like.

The material that forms the transparent film 10 is, for example, a thermoplastic resin excellent in transparency, mechanical strength and heat stability. Specific examples of the thermoplastic resin include cellulose-based resins such as triacetyl cellulose, polyester-based resins, polyether sulfone-based resins, polysulfone-based resins, polycarbonate-based resins, polyamide-based resins, polyimide-based resins, polyolefin-based resins, (meth)acryl-based resin, cyclic polyolefin-based resins (norbornene-based resins), polyarylate-based resins, polystyrene-based resins, polyvinyl alcohol-based resins, and mixtures thereof.

In a case where the anti-reflection film is laminated with the polarizer 8, as shown in FIG. 2, the transparent film 10 has a function as a base for forming the anti-reflection layer 5, and a function as a protective film for the polarizer 8. In a case where the transparent film 10 is laminated on the polarizer 8, the moisture permeability of the transparent film 10 is preferably 100 g/m²·24 h or more, more preferably 130 g/m²·24 h or more, even more preferably 150 g/m²·24 h or more. The moisture permeability is the weight of steam that permeates a sample of 1 m² in area for 24 hours with a relative humidity of 90% at 40° C., which is measured according to the JIS K 7129:2008 Annex B.

If the moisture permeability of the transparent film 10 is higher, moisture in the polarizer is more likely to be released to the outside through the transparent film when the polarizing plate is placed in a heating environment, and thus degradation of the polarizer due to moisture can be suppressed. On the other hand, if the moisture permeability of the transparent film 10 is excessively high, the humidification durability of the polarizing plate may be decreased. Therefore, the moisture permeability of the transparent film 10 is preferably 2000 g/m²·24 h or less, more preferably 1500 g/m²·24 h or less.

In order to set the moisture permeability within the range mentioned above, a cellulosic resin is preferably used as a material for the transparent film 10. Examples of the cellulosic resin include esters of cellulose and fatty acid. Specific examples of cellulose esters include cellulose acetate such as cellulose triacetate and cellulose diacetate, cellulose dipropionate, and cellulose dipropionate. Among these examples, cellulose triacetate is particularly preferred.

One or more optional additives may be included in the transparent film.

Examples of the additives include ultraviolet absorbers, antioxidants, lubricants, plasticizers, release agents, coloring inhibitors, flame retardants, nucleating agents, antistatic agents, pigments, and colorants.

(Hard Coat Layer)

The hard coat layer 11 is preferably disposed on the surface of the transparent film 10. Forming the hard coat layer 11 on the anti-reflection layer 5-forming surface of the transparent film substrate 1 can improve mechanical properties such as the hardness and elastic modulus of the anti-reflection layer. The hard coat layer 11 preferably has high surface hardness and excellent scratch resistance. The hard coat layer 11 can be formed, for example, by applying a solution containing a curable resin onto the transparent film 10.

Examples of the curable resin include a thermosetting resin, an ultraviolet curable resin, and an electron-beam curable resin. Examples of the curable resin include various resins such as polyester, acryl, urethane, acrylic urethane, amide, silicone, silicate, epoxy, melamine, oxetane, and acrylurethane-based resins. One or more of the foregoing curable resins can be appropriately selected.

Among the foregoing resins, acryl-based resins, acrylic urethane-based resins, and epoxy-based resins are preferred because of their high hardness, ultraviolet curability, and excellent productivity, among which acrylic urethane-based resins are preferred. The ultraviolet curable resins include ultraviolet curable monomers, oligomers, and polymers. Preferable examples of the ultraviolet curable resins include resins having an ultraviolet polymerizable functional group, in particular, resins including, as a constituent, an acryl-based monomer or oligomer having two or more, especially 3 to 6 ultraviolet polymerizable functional groups.

In order for forming an anti-reflection film with an anti-glare property and an antidazzle property, the hard coat layer disposed on the surface of the transparent film preferably has an anti-glare property. Examples of the anti-glare hard coat layer include a curable resin matrix and fine particles dispersed therein. Various kinds of transparent fine particles can be used as the fine particles dispersed in the resin matrix without particular limitation. Examples of the transparent fine particles include: fine particles of various metal oxides such as silica, alumina, titania, zirconia, calcium oxide, tin oxide, indium oxide, cadmium oxide, and antimony oxide; glass fine particles; crosslinked or uncrosslinked organic fine particles composed of various transparent polymers such as polymethyl methacrylate, polystyrene, polyurethane, acryl-styrene copolymers, benzoguanamine, melamine, and polycarbonate; and silicone-based fine particles. One or more of the foregoing fine particles can be appropriately selected. Among the foregoing fine particles, fine particles having higher refractive index than the matrix resin are preferred, and organic fine particles with a refractive index of 1.5 or more, such as styrene beads (refractive index: 1.59), are preferred. The average particle size of fine particles is preferably 1 to 10 μm, more preferably 2 to 5 μm. Although the proportion of the fine particles is not particularly limited, the proportion of the fine particle is preferably 6 to 20 parts by weight with respect to 100 parts by weight of the matrix resin.

The hard coat layer can be formed, for example, by applying a solution containing a curable resin onto the transparent film 10. The solution for forming the hard coat layer preferably contain an ultraviolet polymerization initiator blended therein. In order to form an anti-glare hard coat layer including fine particles, it is preferable to apply, onto the transparent film, a solution containing the above-mentioned fine particles in addition to the curable resin. The solution may contain additives such as leveling agents, thixotropic agents, and antistatic agents. In the formation of the anti-glare hard coat layer, the adoption of the solution containing therein a thixotropic agent (silica, mica, etc. having particle size of 0.1 μm or less) can easily form a fine irregular structure of protruding particles on the surface of the hard coat layer.

Although the thickness of the hard coat layer 11 is not particularly limited, the thickness is preferably 0.5 μm or more, more preferably 1 μm or more in order to achieve high hardness. Considering ease of formation by the application, the thickness of the hard coat layer is preferably 15 μm or less, more preferably 12 μm or less, and further preferably 10 μm or less. In addition, the thickness of the hard coat layer 11 preferably falls within the above-mentioned range, in order to keep the moisture permeability of the film substrate high so as not to hinder the release of moisture from the polarizer to the outside.

The arithmetic mean roughness Ra of the surface of the transparent film substrate 1 on the side on which the anti-reflection layer 5 is formed is preferably 1.5 nm or less, more preferably 1.0 nm or less. In a case where the hard coat layer 11 is formed on the transparent film 10, the arithmetic mean roughness of the hard coat layer 11 is regarded as the arithmetic mean roughness of the surface of the transparent film 10 on the side on which the anti-reflection layer 5 is formed. The arithmetic mean roughness Ra can be obtained from a 1 μm square observation image through the use of an atomic force microscope (AFM).

The formation of the hard coat layer 11 by the application as mentioned above can reduce the arithmetic mean roughness of the surface of the transparent film substrate 1. As long as the surface of the transparent film substrate 1 is smooth, the arithmetic mean roughness of the surface of the anti-reflection layer 5 formed on the transparent film substrate 1 is also reduced, and the scratch resistance of the anti-reflection film tends to be improved.

(Surface Treatment)

For the purpose of improving adhesion to the anti-reflection layer 5, the surface of the transparent film substrate 1 may be subjected to a surface modification treatment such as a corona treatment, a plasma treatment, a flame treatment, an ozone treatment, a primer treatment, a glow treatment, a saponification treatment, a treatment with a coupling agent. For example, carrying out a plasma treatment in a vacuum modifies the surface of the substrate, and forms appropriate irregularities at the surface, thereby making it possible to improve the adhesion between the transparent film substrate 1 (hard coat layer 11) and the anti-reflection layer 5. In addition, the deposition of the anti-reflection layer on the irregularities formed by the plasma treatment at the surface tends to increase the moisture permeability of the anti-reflection film. As described later, in order to improve the adhesion between the transparent film substrate 1 and the anti-reflection layer 5, the adhesion improvement layer 3 may be disposed on the transparent film substrate 1.

<Anti-Reflection Layer>

On the transparent film substrate 1, the anti-reflection layer 5 is formed. The anti-reflection layer 5 is composed of two or more thin-films In general, for the anti-reflection layer, the optical thickness (the product of the refractive index and the thickness) of the thin-film is adjusted such that the inverted phases of incident light and reflected light cancel each other out. The anti-reflection layer composed of a multilayer stack of two or more thin-films having different refractive indexes can reduce the reflectance in a wide wavelength range of visible light.

Examples of the materials of the thin-films constituting the anti-reflection layer 5 include oxides, nitrides, and fluorides of metals. For example, examples of low refractive index materials with a refractive index of 1.6 or less at a wavelength of 550 nm include a silicon oxide and a magnesium fluoride. Examples of high refractive index materials with a refractive index of 1.9 or more at a wavelength of 550 nm include a titanium oxide, a niobium oxide, a zirconium oxide, a tin-doped indium oxide (ITO), and an antimony-doped tin oxide (ATO). In addition to the low refractive index layer and the high refractive index layer, for example, a thin-film made of a titanium oxide or a mixture of the low refractive index material and the high refractive material may be formed as a medium refractive index layer with a refractive index approximately from 1.50 to 1.85. The thin-films constituting the anti-reflection layer preferably have small light absorption of visible light, and materials with an extinction coefficient of 0.5 or less at a wavelength of 550 nm are preferably used for the thin-films.

Examples of stacking structure of the anti-reflection layer 5, from the side of the transparent film 10, include: a two-layer structure of a high refractive index layer with an optical thickness approximately from 240 nm to 260 nm and a low refractive index layer with an optical thickness approximately from 120 nm to 140 nm; a three-layer structure of a medium refractive index layer with an optical thickness approximately from 170 nm to 180 nm, a high refractive index layer with an optical thickness approximately from 60 nm to 70 nm, and a low refractive index layer with an optical thickness approximately from 135 nm to 145 nm; a four-layer structure of a high refractive index layer with an optical thickness approximately from 20 nm to 55 nm, a low refractive index layer with an optical thickness approximately from 15 nm to 70 nm, a high refractive index layer with an optical thickness approximately from 60 nm to 330 nm, and a low refractive index layer with an optical thickness approximately from 100 nm to 160 nm; and five-layer of a low refractive index layer with an optical thickness approximately from 15 nm to 30 nm, a high refractive index layer with an optical thickness approximately from 20 nm to 40 nm, a low refractive index layer with an optical thickness approximately from 20 nm to 40 nm, a high refractive index layer with an optical thickness approximately from 240 nm to about 290 nm, and a low refractive index layer with an optical thickness approximately from 100 nm to 200 nm. The refractive index and film thickness ranges of the thin-films constituting the anti-reflection layer are not limited to the examples mentioned above. Furthermore, the anti-reflection layer 5 may be a stack of six or more thin-films.

The anti-reflection layer is preferably an alternative stack of a low refractive index layer and a high refractive index layer. In order to reduce reflection at the air interface, the thin-film 54 disposed as the outermost surface layer (the surface on the side opposite to the transparent film substrate 1) of the anti-reflection layer is preferably a low refractive index layer. The materials for the low refractive index layer and the high refractive index layer are preferably oxides as mentioned above. In particular, the anti-reflection layer 5 is preferably an alternative stack of silicon oxide ($SiO_2$) thin-films 52 and 54 as low refractive index layers and niobium oxide ($Nb_2O_5$) thin-films 51 and 53 as high refractive index layers.

The moisture permeability of the anti-reflection layer 5 is preferably 15 g/m$^2$·24 h or more, more preferably 20 g/m$^2$·24 h or more, further preferably 30 g/m$^2$·24 h or more.

The increased moisture permeability of the anti-reflection layer can suppress retention of moisture, and improve durability at high temperature. From viewpoints such as further improvement in durability at high temperature, the moisture permeability of the anti-reflection layer 5 may be 100 g/m$^2$·24 h or more or 130 g/m$^2$·24 h or more. When the moisture permeability of the anti-reflection layer is excessively high, the durability at high humidity tends to be decreased, and thus, the moisture permeability of the anti-reflection layer 5 is preferably 1000 g/m$^2$·24 h or less, more preferably 500 g/m$^2$·24 h or less.

The anti-reflection layer is a thin-film, and it is difficult to measure the moisture permeability from a sample consisting of thin-film. Therefore, the moisture permeability may be measured, with the anti-reflection layer formed on the transparent film substrate. Since most of resin films have sufficiently high moisture permeability than inorganic oxide layers, the moisture permeability of the anti-reflection film with the anti-reflection layer 5 formed on the transparent film substrate 1 can be considered equal to the moisture permeability of the anti-reflection layer 5. Therefore, the moisture permeability of the anti-reflection film according to the present invention is preferably 15 to 1000 g/m$^2$·24 h, more preferably 20 to 500 g/m$^2$·24 h or more.

When the anti-reflection film including the anti-reflection layer 5 disposed on the transparent film substrate 1 or the anti-reflection layer-equipped polarizing plate is exposed to a heating environment, moisture in the transparent film 10 or the polarizer 8 evaporates to the outside of the film. In a case where the moisture permeability of the anti-reflection layer is lower, moisture is less likely to diffuse to the outside of the system. When moisture remains within the polarizing plate, triacetyl cellulose and the like of the transparent film 10 are likely to be hydrolyzed and the protection performance of the polarizer tends to be degraded. In addition, when acetyl cellulose is hydrolyzed, a free acid is generated. In the presence of an acid, the polyvinyl alcohol constituting the polarizer is likely to turn into polyene, which causes deterioration of the polarizing plate. On the other hand, when the anti-reflection layer 5 has a high moisture permeability, it is believed that because moisture evaporated from the polarizer and the transparent film is likely to diffuse from the surface of the anti-reflection layer 5 to the outside of the system, the moisture is kept from remaining, thereby keeping the polarizing plate from being deteriorated at high temperature.

The indentation elastic modulus of the anti-reflection layer 5 is preferably 20 GPa or more, more preferably 30 GPa or more. The increased elastic modulus of the anti-reflection layer improves scratch resistance. On the other hand, if the elastic modulus is excessively high, handling abilities such as film transportability may be deteriorated in some cases. Therefore, the indentation elastic modulus of the anti-reflection layer 5 is preferably 100 GPa or less, more preferably 70 GPa or less. For the same reason, the indentation hardness of the anti-reflection layer is preferably 0.5 to 10 GPa, and more preferably 1 to 5 GPa. The indentation elastic modulus and the indentation hardness are measured by nano-indentation.

The arithmetic mean roughness Ra of the surface of the anti-reflection layer 5 is preferably 3 nm or less, more preferably 1.8 nm or less, further preferably 1.55 nm or less, particularly preferably 1.3 nm or less. The reduced arithmetic mean roughness tends to improve scratch resistance. In particular, when the arithmetic mean roughness of the surface of the anti-reflection layer 5 is 1.5 nm or less, there is a tendency to improve the wiping ability achieved when stains such as sebum adhere to the surface. On the other hand, if the arithmetic mean roughness of the surface is excessively low, there is a tendency to make it difficult to perform roll conveyance of the anti-reflection layer 5 during film manufacture etc. The arithmetic mean roughness of the surface of the anti-reflection layer 5 is thus preferably 0.3 nm or more, and more preferably 0.5 nm or more.

The method for forming the thin-films constituting the anti-reflection layer is not particularly limited, and may be any of a wet coating method and a dry coating method. Dry coating methods such as vacuum vapor deposition, CVD, sputtering, electron beam evaporation are preferred, since it is possible to form a thin-film which is uniform in film thickness and dense. Above all, a sputtering method is particularly preferred, since it is easy to form a film which has high mechanical strength with the elastic modulus mentioned above. The productivity of the anti-reflection film can be improved by carrying out continuous deposition while conveying a long-band film substrate in one direction (machine direction) by a roll-to-roll method.

Deposition of an oxide layer such as a silicon oxide or a niobium oxide by a sputtering method can be carried out by any of a method of using an oxide target and reactive sputtering in which a metal target is used. In order to deposit an insulating oxide such as a silicon oxide with the use of an oxide target, RF discharge is required, thus leading to a low deposition rate and low productivity. Therefore, reactive sputtering with the use of a metal target is preferred for sputtering deposition of the oxide. For the reactive sputtering, the deposition is performed while introducing an inert gas such as argon and a reactive gas such as oxygen into the chamber. For the reactive sputtering, it is preferable to adjust the amount of oxygen so as to maintain an intermediate transition region between the metal region and the oxide region. When the deposition is performed in the metal region where the amount of oxygen is insufficient, the oxygen amount of the obtained film is significantly smaller as compared with the stoichiometric composition, and the anti-reflection layer tends to have metallic luster, thereby decreasing the transparency. In addition, in the oxide region where the amount of oxygen is larger, the deposition rate tends to be extremely decreased. The amount of oxygen is adjusted such that the sputtering deposition is performed in the transition region, thereby allowing an oxide film to be formed at a high rate. In addition, the deposition in the transition region tends to increase the moisture permeability of the obtained film, and then improve the durability at high temperature. As a sputtering power source for use in the reactive sputtering, DC or MF-AC is preferred.

Methods for controlling the oxygen introduction amount so as to maintain the deposition mode in the transition region in a reactive dual magnetron sputtering method include a plasma emission monitoring method (PEM method) of sensing the plasma emission intensity of discharge and then controlling the gas introduction amount into the deposition chamber. In the PEM, the control is achieved by sensing the plasma emission intensity and feeding the intensity back to the oxygen introduction amount. For example, the deposition in the transition region can be maintained by achieving the PEM control with the control value (set point) of the emission intensity set within a predetermined range, and then adjusting the oxygen introduction amount. In addition, control may be achieved by an impedance method of controlling the oxygen introduction amount so as to make the plasma impedance constant, that is, make the discharge voltage constant.

As long as the oxygen introduction amount is controlled by the PEM method or the impedance method, the deposition rate in the continuous thin-film formation by the roll-to-roll method can be kept constant in the machine direction. Therefore, the film thickness of the thin-film is made uniform, thereby providing an anti-reflection film which has excellent anti-reflection characteristics. The uniformity of the quality in the transverse direction can be also improved by providing a plurality of oxygen introduction pipes in the transverse direction and individually controlling the flow rates of oxygen introduced from the respective pipes.

In the sputtering deposition, discharge anomalies may sometimes occur due to, for example, adhesion of particles to the target surface, and the film quality of the thin-film will be decreased at the parts where discharge anomalies occur. Such discharge anomalies can be also monitored by the plasma emission or the discharge voltage. When the amount of plasma emission falls outside the control range due to a discharge anomaly or the like, there is a high possibility that the film quality or the film thickness has an abnormality. Therefore, when this part is determined to be "defective", and subjected to marking with a marking device arranged downstream of the sputtering deposition part, the defective part can be easily removed from the long-band anti-reflection film.

In the sputtering method, sputtered particles also have high energy because the material is struck from the target by causing high-energy sputtering gas (for example, Ar) to collide against the target. Therefore, in the sputtering method, a dense film is more likely to be formed as compared with a vacuum deposition method or a CVD method. In general, a thin-film formed by a sputtering method has a low moisture permeability, for example, the moisture permeability of a silicon oxide film is often 10 g/m$^2$·24 h or less in many cases.

A thin-film with a moisture permeability of 15 g/m$^2$·24 h or more can be formed by adjusting the conditions for sputtering deposition. For example, in the case of a low discharge voltage during sputtering deposition, the low kinetic energy of sputtered particles suppresses diffusion at the substrate surface. Therefore, a film is likely to grow in a columnar shape, and the film quality is likely to be porous. In the case of a high discharge voltage, a film is likely to be formed in a planar shape, and likely to be dense in film quality. On the other hand, when the discharge voltage is excessively increased, neutral particles such as recoil Ar damages the film surface, and then causes defects, and the film density tends to be decreased.

In magnetron sputtering, as the magnetic field is stronger (the magnetic flux density is higher), there is a tendency to suppress the expansion of plasma, and then increase plasma density. Accordingly, the discharge voltage can be reduced, and thus, as mentioned above, there is a tendency for the film to grow in a columnar shape, thereby increasing the moisture permeability. In addition, the decreased kinetic energy of the sputtered particles with the decrease in discharge voltage can reduce damage due to recoil Ar particles and the like.

Therefore, the film surface is likely to be smooth, thereby providing an anti-reflection film which is small in arithmetic mean roughness Ra, and excellent in scratch resistance and fingerprint wiping-off property. The magnetic flux density of the target surface during sputtering deposition is preferably 20 mT or more, more preferably 35 mT or more, further preferably 45 mT or more, particularly preferably 55 mT or more.

The high pressure during the deposition reduces the mean free path of sputtered particles, and then decreases the directivity of sputtered particles to make the sputtered particles more likely to be diffused by Ar, and thus the film quality is more likely to be porous. On the other hand, the excessively high deposition pressure decreases the deposition rate. In addition, the high deposition pressure tends to make the plasma discharge unstable. In order to form an oxide thin-film with high moisture permeability and sufficient mechanical strength, the deposition pressure is preferably 0.4 Pa to 1.5 Pa.

In addition to the conditions for sputtering deposition, the surface profile or the like of the substrate to serve as a deposition base may also affect the film growth mode in some cases. For example, as described previously, when the surface of the transparent film substrate is subjected to a plasma treatment, due to irregularities formed at the surface, the sputtered film is likely to grow in a columnar shape, and there is a tendency to increase the moisture permeability.

(Adhesion Improvement Layer)

The adhesion between the organic material such as the hard coat layer 11 and the oxide thin-film is often insufficient. Therefore, it is preferable to disposed an adhesion improvement layer 3 between the transparent film substrate 1 and the anti-reflection layer 5. Examples of the material of the adhesion improvement layer 3 include: metals such as silicon, nickel, chromium, aluminum, tin, gold, silver, platinum, zinc, titanium, tungsten, zirconium and palladium; alloys composed of two or more of the metals; and oxides, nitrides, and fluorides of the metals.

Because of the high light transmittance and the high adhesion to both an organic layer and an oxide layer, an oxide that has a smaller amount of oxygen than the stoichiometric composition is particularly preferred as the adhesion improvement layer 3. The oxygen amount in the adhesion improvement layer 3 is preferably approximately 60 to 95% of the stoichiometric composition. For example, in the case of forming a silicon oxide ($SiO_x$) layer as the adhesion improvement layer 3, x is preferably from 1.2 to 1.9.

The adhesion improvement layer 3 may have a thickness so as not to deteriorate the transparency of the transparent film substrate 1, and the thickness is, for example, approximately 1 nm to 10 nm or less. The adhesion improvement layer 3 can be formed by a sputtering method, a vacuum vapor deposition method, an ion plating method, a CVD method, or the like. In a case where the anti-reflection layer 5 is formed by a sputtering method, the adhesion improvement layer 3 and the anti-reflection layer 5 can be continuously formed through one pass while conveying the transparent film substrate 1. Therefore, the adhesion improvement layer 3 is preferably formed by a sputtering method.

In sputtering deposition of an oxide thin-film having a smaller amount of oxygen than the stoichiometric composition, the oxygen introduction amount may also be controlled by the PENT method or the impedance method.

(Antifouling Layer)

The anti-reflection film is disposed on the outermost surface of a display such as a liquid crystal display device, and thus likely to be affected by stain (fingerprints, stains, dust, etc.) from the external environment in practical use. In particular, the low refractive index layer such as $SiO_2$ disposed on the outermost surface of the anti-reflection layer has high wettability, to which stains such as fingerprints and stains are likely to adhere. In addition, the anti-reflection layer made of an oxide has more noticeable stain than general transparent films, and stains are more likely to adhere to the layer, and thus changes in the surface reflectance and adhering substances which stand out in white and then turn visible may make the display blurry.

In order to prevent external environmental stains from adhering and to facilitate the removal of adhered stains, it is preferable to dispose an antifouling layer 7 on the surface of the anti-reflection layer 5. In order to prevention of adherence of stain and enhance the removal of adhered stains, the pure water contact angle of the antifouling layer 7 is preferably 100° or more, more preferably 102° or more, further preferably 105° or more. The pure water contact angle is obtained by forming a water droplet of 2 mm or less in diameter on the surface of the antifouling layer and measuring the contact angle.

In order to maintain the anti-reflection characteristics of the anti-reflection layer 5, the antifouling layer 7 preferably has a small difference in refractive index from the low refractive index layer 54 for the outermost surface of the anti-reflection layer 5. The refractive index of the antifouling layer 7 is preferably 1.6 or less, more preferably 1.55 or less. Fluorine group-containing silane-based compounds, fluorine group-containing organic compounds, and the like are preferred as the material of the antifouling layer 7.

The antifouling layer 7 can be formed by a wet method such as a reverse coating method, a die coating method, or a gravure coating method, a dry method such as a CVD method. The thickness of the antifouling layer 7 is typically approximately 1 to 100 nm, preferably 2 to 50 nm, and more preferably 3 to 30 nm.

In order to maintain the mechanical strength of the anti-reflection layer 5, such as scratch resistance, the surface of the antifouling layer 7 preferably also has a small arithmetic mean roughness Ra, as with the anti-reflection layer 5. The arithmetic mean roughness of the surface of the anti-fouling layer 7 (i.e., the arithmetic mean roughness of the surface of the anti-reflection film) is preferably 3 nm or less, more preferably 2 nm or less, further preferably 1.8 nm or less, particularly preferably 1.5 nm or less, most preferably 1.3 nm or less. When the arithmetic mean roughness of the anti-reflection film surface is 1.5 nm or less, there is a tendency to improve the fingerprint wiping-off property.

[Anti-Reflection Layer-Equipped Polarizing Plate]

The anti-reflection film according to the present invention can be put into practical use by laminating with a polarizer to form an anti-reflection layer-equipped polarizing plate as shown in FIG. 2. In the anti-reflection layer-equipped polarizing plate 110 shown in FIG. 2, one surface of the polarizer 8 is bonded to a principal surface of the transparent film substrate 1 on the side opposite to the anti-reflection layer-formed surface. Another transparent film 9 is bonded to the other surface of the polarizer 8.

The polarizer 8 is, for example, one obtained by uniaxially stretching a hydrophilic polymer film such as a polyvinyl alcohol-based film, a partially formalized polyvinyl alcohol-based film or an ethylene-vinyl acetate copolymer-based partially saponified film with a dichromatic substance such as iodine or a dichromatic dye adsorbed to the film; or a polyene-based oriented film such as a dehydrated product of a polyvinyl alcohol or a dehydrochlorinated product of a polyvinyl chloride.

Among these polarizers, because of high polarization degree, polyvinyl alcohol (PVA)-based polarizers are preferable in which a dichroic substance such as iodine or a dichroic dye is adsorbed into a polyvinyl alcohol-based film such as polyvinyl alcohol film or a partially formalated polyvinyl alcohol film and the polyvinyl alcohol-based film is subjected to orientation in one direction. PVA-based polarizer can be obtained, for example, by iodine-dying and stretching a polyvinyl alcohol-based film As the PVA-based polarizer, a thin polarizer having a thickness of 10 μm or less may also be used. Examples of the thin polarizer include thin polarizers as described in JP 51-069644 A, JP 2000-338329 A, WO 2010/100917, JP 4691205 B, JP 4751481 B, and so on. These thin polarizers are obtained by, for example, a production method including the steps of: stretching a laminate of WA-based resin layer and a stretchable resin base material; and performing iodine dying to the PVA-based resin layer.

As the transparent film 9, the same materials as described previously as the material of the transparent film 10 are preferably used. It is to be noted that the material of the transparent film 9 may be the same as or different from the material of the transparent film 10.

For bonding the polarizer and the transparent film, it is preferable to use an adhesive. As the adhesive, an acryl-based polymer, a silicone polymer, a polyester, a polyurethane, a polyamide, a polyvinyl alcohol, a polyvinyl ether, a vinyl acetate/vinyl chloride copolymer, a modified polyolefin, an epoxy polymer, a fluorine-based polymer, a rubber-based polymer, or the like as a base polymer can be appropriately selected. For the adhesion of the PVA polarizer, a polyvinyl alcohol-based adhesive is preferable.

The anti-reflection film and the anti-reflection layer-equipped polarizing plate according to the present invention are used for displays such as liquid crystal display devices and organic EL display devices. In particular, when the anti-reflection film or the polarizing plate is disposed on the outermost surface of the display, it contributes to improvements in display visibility, achieved by anti-reflection. Even when exposed to a high-temperature environment for a long period of time, the anti-reflection film and the anti-reflection layer-equipped polarizing plate according to the present invention are excellent in high-temperature reliability and unlikely to cause deterioration, and thus particularly suitably used for vehicle displays and the like.

EXAMPLES

Hereinafter, the present invention will be described in more detail with reference to examples, but the present invention is not to be considered limited to the following examples.

[Preparation of Film with Anti-Glare Hard Coat Layer]

A solution with a solid content of 40% by weight, obtained by mixing 100 parts by weight of an ultraviolet-curable urethane acrylate-based monomer (refractive index: 1.51), 14 parts by weight of polystyrene beads (refractive index: 1.59) of 3.5 μm in average particle size (particle distribution range: 3.0 to 4.1 μm), 5 parts by weight of a benzophenone-based photopolymerization initiator, and 171 parts by weight of toluene was applied onto an 80 μm-thick triacetyl cellulose film (refractive index: 1.49), and dried at 120° C. for 5 minutes. Thereafter, the film was subjected to a curing treatment by ultraviolet irradiation, thereby forming an anti-glare hard coat layer of about 4 μm in thickness with an irregular structure on the surface. The arithmetic mean roughness Ra of the anti-glare hard coat layer was 0.43 nm.

Example 1

The triacetyl cellulose film with the anti-glare hard coat layer formed thereon was introduced into a roll-to-roll type sputtering deposition apparatus, the surface with the anti-glare hard coat layer was subjected to a bombardment treatment (plasma treatment with Ar gas), a 3.5 nm-thick $SiO_x$ layer (x<2) was formed as an adhesion improvement layer, and a 12 nm-thick $Nb_2O_5$ layer, a 28 nm-thick $SiO_2$ layer, a 100 nm-thick $Nb_2O_5$ layer, and an 85 nm-thick $SiO_2$ layer were formed thereon in this order. On the anti-reflection layer, a fluorine-based resin was formed as an antifouling layer to have a thickness of 5 nm, thereby prepare an anti-reflection film.

(Bombardment Treatment)

The bombardment treatment was performed under the conditions of pressure: 0.5 Pa and effective power density: 0.34 W min/m·cm². The arithmetic mean roughness Ra of the surface of the anti-glare hard coat layer subjected to the bombardment treatment (before formation of the adhesion improvement layer and anti-reflection layer formed) was 0.51 nm, which was larger than before the treatment. The effective power density refers to a value obtained by dividing the power density (W/cm²) of the plasma output by the speed (m/min) of conveying the film substrate by the roll-to-roll method. Even with the same plasma power, the effective power for the treatment will be decreased when the conveying speed is higher.

(Sputtering Deposition)

The $SiO_x$ layer as the adhesion improvement layer was formed at a pressure of 0.4 Pa by applying 40 kHz MF-AC power of 3 W/cm² to an Si target. An Si target and an Nb target were used respectively for formation of the $SiO_2$ layer and the $Nb_2O_5$ layer, respectively, and deposition was performed at the voltage and pressure shown in Table 1. In formation of the oxide thin-film, the pressure was kept constant by adjusting the introduction amount and discharge amount of argon, and the oxygen introduction amount was adjusted by plasma emission monitoring (PEM) control, such that the deposition mode was kept in the transition region.

Examples 2 to 5 and Comparative Examples 1 to 4

The effective power density of the bombardment treatment and the discharge voltages and pressures during the formation of the $SiO_2$ layer and the $Nb_2O_5$ layer were changed as shown in Table 1. For Examples 4 and 5 and Comparative Examples 1 to 4, the magnet was changed to perform the deposition under the condition of the magnetic flux density of the target surface was 80 mT. For Example 5 and Comparative Example 3, the oxygen introduction amount was adjusted by PEM control such that the deposition mode was kept in the oxidization region.

Comparative Example 5

The hard coat layer surface of the anti-glare hard coat layer-formed triacetyl cellulose was subjected to a bombardment treatment under the conditions of pressure: 0.15 Pa and effective power density of 0.10 W min/m cm². A 12 nm-thick $Nb_2O_5$ layer, a 28 nm-thick $SiO_2$ layer, a 100 nm-thick $Nb_2O_5$ layer, and an 85 nm-thick $SiO_2$ layer were formed thereon in this order by a vacuum deposition method, and an antifouling layer was formed on the anti-reflection layer in the same way as in Example 1, thereby preparing an anti-reflection film.

Comparative Example 6

On the hard coat layer surface of the anti-glare hard coat layer-formed triacetyl cellulose film, a 100 nm-thick low refractive index layer was formed by wet coating, thereby forming an anti-reflection film. As a material for the low refractive index layer, a fluorine compound polymer was used which was produced by a sol-gel reaction of a mixture of polysiloxane and fluoroalkylsilane.

Comparative Example 7

The surface of the anti-glare hard coat layer was subjected to a bombardment treatment under the conditions of pressure: 0.5 Pa and effective power density: 0.10 W min/m·cm². Thereafter, in the same way as in Comparative Example 6, an anti-reflection film was prepared.

[Evaluation of Anti-reflection Film]

The anti-reflection films according to the Examples and Comparative Examples were evaluated by the following methods.

(Moisture Permeability)

According to JIS K 7129:2008 Annex B, the moisture permeability of the anti-reflection film was measured in an atmosphere at a temperature of 40° C. and a humidity of 90% RH. Since the moisture permeability of the film substrate is sufficiently larger as compared with the moisture permeability of the anti-reflection layer, the moisture permeability of the entire anti-reflection film was considered equal to the moisture permeability of the anti-reflection layer.

(Arithmetic Mean Roughness)

The arithmetic mean roughness was determined from a 1 μm-square observation image with obtained by an atomic force microscope (AFM) observation.

(Indentation Elastic Modulus)

A sample in which a transparent film side of the anti-reflection film is attached to a glass slide was fixed on a stage of a nano intender (TI 950 TriboIndenter, manufactured by Hysitron, Inc.), with the anti-reflection layer facing upward. The measurement was made by gradually applying a load with the use of a Berkovich (triangular pyramid) type diamond indenter (the radius of curvature at the tip: 0.1 μm), and gradually returning the load down to 0 after reaching the maximum load, under a measurement environment at 23° C. and 50% RH. The indentation elastic modulus Er at a depth of around 10 nm was calculated by the following formula.

$$Er=(S\sqrt{\pi})/(2\sqrt{A})$$

S: Slope of Unloading Curve

π: Pi

A: Projected Area of Contact between Indenter and Sample

It is to be noted that the projected area A of contact between the indenter and the sample was determined by the method described in JP-A-2005-195357.

(Scratch Resistance Strength)

With steel wool (Nippon Steel Wool Bonstar #0000) fixed in a scratch tester, a load of 2,000 g was applied to carry out a scratch test of reciprocating 10 times, and the appearance of the surface of the anti-reflection film after the test was visually confirmed. The sample with no scratch confirmed was rated as good, and the sample with a scratch confirmed was rated as bad.

(Fingerprint Wiping-Off Property)

Sebum was forcibly attached to the surface of the anti-reflection film (the antifouling layer according to Examples 1 to 5 and Comparative Examples 1 to 5, the fluorine-based anti-reflection layer according to Comparative Examples 6 and 7). With a cellulose nonwoven fabric wiper (Asahi Kasei Bemkot M-1) attached to a sliding tester, and with a load of 200 g applied, the surface of the antifouling layer was reciprocated 10 times, and whether the sebum was wiped off was visually confirmed. The sample with the sebum wiped off was rated as good, and the sample with the sebum incompletely wiped off was rated as bad.

[Preparation of Anti-Reflection Layer-Equipped Polarizing Plate]

The anti-reflection film in each of the Examples and the Comparative Examples was bonded to one surface of a polarizer, and a 30 μm-thick transparent film, made of a modified acryl-based polymer including a lactone ring structure (moisture permeability: 125 g/m$^2$·24 h), was bonded to the other surface of the polarizer, thereby preparing an anti-reflection layer-equipped polarizing plate. As the polarizer, a PVA-based polarizer was used in which a 75-μm thick polyvinyl alcohol film with average polymerization degree of 2,700 was stretched by 6 times in length while dyeing with iodine. The PVA-based polarizer and the transparent film were bonded to each other through a roll laminator with using an adhesive, and thereafter heated and dried in an oven. The adhesive was an aqueous solution including a polyvinyl alcohol resin containing an acetoacetyl group (average polymerization degree of 1200, saponification degree of 98.5 mol % and acetoacetylation degree of 5 mol %) and methylolmelamine at a weight ratio of 3:1.

[Evaluation of Heating Reliability of Polarizing Plate]

The obtained anti-reflection layer-equipped polarizing plate was put in a hot-air oven at 95° C., and taken out after 1000 hours. A commercially available polarizing plate was placed on a backlight, the anti-reflection layer-equipped polarizing plate after the heating test was placed thereon in a cross nicol arrangement, and the presence or absence of a change in appearance was visually confirmed. The polarizing plate found to be unchanged in appearance between before and after the heating test was rated as good, and the polarizing plate found to be changed was rated as bad.

Figure 3:
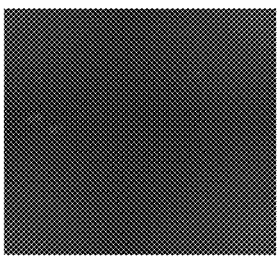
FIG. 3 is an appearance photograph of polarizing plates according to Examples and Comparative Examples before and after a heating test (95° C., 1000 hours).
Figure 3:
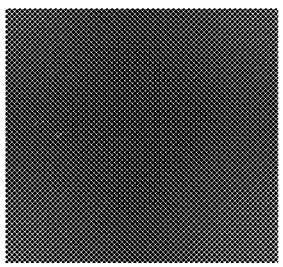
Figure 3:
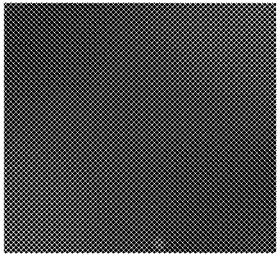
Figure 3:
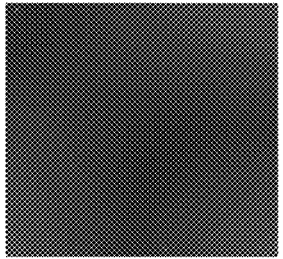
Figure 3:
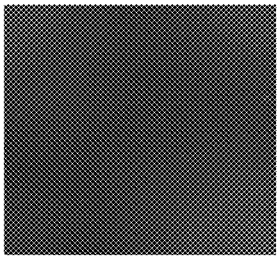
Figure 3:
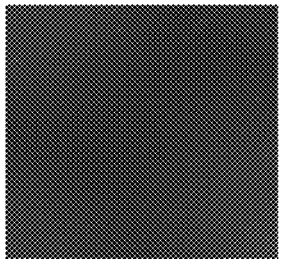
Figure 3:
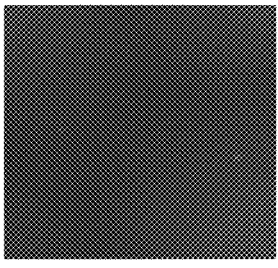
Figure 3:
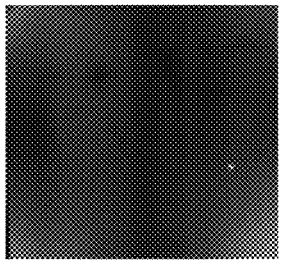

Table 1 shows the conditions for the preparation of the anti-reflection films according to the Examples and the Comparative Examples, the results of evaluating the anti-reflection films, and the results of evaluating the heating reliability of the polarizing plates. In addition, FIG. 3 shows the appearances (cross-nicol observations) of the polarizing plates according to Examples 1 to 3 and Comparative Example 1 before and after the heating test.

TABLE 1

| | Conditions for Preparation | | | | | | | | |
|---|---|---|---|---|---|---|---|---|---|
| | Bombardment Treatment for Substrate | | | | | | | | |
| | Effective Power Density (W·min/cm$^2$·m) | Pressure (Pa) | Method for Formation of Anti-reflection Layer | Conditions for Sputtering deposition | | | | | |
| | | | | Magnetic Flux Density (mT) | Discharge Voltage (V) | | Deposition Pressure (Pa) | | Deposition Mode |
| | | | | | SiO$_2$ | Nb$_2$O$_5$ | SiO$_2$ | Nb$_2$O$_5$ | |
| Example 1 | 0.34 | 0.5 | sputtering | 40 | 530 | 570 | 1.0 | 0.5 | transition region |
| Example 2 | 0.34 | 0.5 | sputtering | 40 | 535 | 570 | 0.8 | 0.5 | transition region |
| Example 3 | 0.34 | 0.5 | sputtering | 40 | 490 | 570 | 0.5 | 0.5 | transition region |
| Example 4 | 0.34 | 0.5 | sputtering | 80 | 350 | 470 | 0.5 | 0.5 | transition region |
| Example 5 | 0.34 | 0.5 | sputtering | 80 | 320 | 470 | 0.6 | 0.5 | oxidization region |
| Comparative Example 1 | 0.10 | 0.5 | sputtering | 80 | 400 | 470 | 0.1 | 0.5 | transition region |
| Comparative Example 2 | 0.34 | 0.5 | sputtering | 80 | 400 | 470 | 0.1 | 0.5 | transition region |
| Comparative Example 3 | 0.10 | 0.6 | sputtering | 80 | 320 | 470 | 0.5 | 0.5 | oxidization region |
| Comparative Example 4 | 0.34 | 0.5 | sputtering | 80 | 370 | 470 | 0.3 | 0.5 | transition region |
| Comparative Example 5 | 0.10 | 0.15 | vacuum vapor deposition | | | | | | |
| Comparative Example 6 | | | wet | | | | | | |
| Comparative Example 7 | 0.10 | 0.5 | wet | | | | | | |

TABLE 1-continued

|  | Properties of Anti-reflection Film | | | | | Heating |
|---|---|---|---|---|---|---|
|  | Moisture Permeability (g/m² 24h) | Ra (nm) | Indentation Elastic Modulus (Gpa) | Scratch Resistance | Fingerprint Wiping-off Property | Reliability of Polarizing Plate |
| Example 1 | 325 | 1.23 | 35 | good | good | good |
| Example 2 | 305 | 1.14 | 37 | good | good | good |
| Example 3 | 150 | 1.11 | 40 | good | good | good |
| Example 4 | 200 | 1.01 | 41 | good | good | good |
| Example 5 | 15 | 0.89 | 41 | good | good | good |
| Comparative Example 1 | 1.1 | 0.99 | 41 | good | good | bad |
| Comparative Example 2 | 3.5 | 1.00 | 41 | good | good | bad |
| Comparative Example 3 | 7 | 1.00 | 41 | good | good | bad |
| Comparative Example 4 | 4 | 1.41 | 41 | good | good | bad |
| Comparative Example 5 | 342 | 1.35 | 5.6 | bad | good | good |
| Comparative Example 6 | 345 | 1.45 | 3 | bad | good | good |
| Comparative Example 7 | 340 | 2.00 | 3 | bad | bad | good |

Assessment of the correlation between the sputtering deposition conditions for the anti-reflection layer and the properties of the anti-reflection layers in Examples 1 to 3 reveals that there is a tendency to increase the mechanical strength (indentation elastic modulus), decrease the moisture permeability of the anti-reflection layer, and decrease the arithmetic mean roughness Ra, as the pressure during sputtering deposition is decreased. In addition, comparison between Example 4 and Comparative Example 2 also reveals that there is a tendency to decrease the moisture permeability of the anti-reflection layer, with the decrease in pressure during the sputtering deposition. From these results, it is believed that a dense film is likely to be formed when the sputtering deposition is performed at low pressure, whereas with the increase in deposition pressure, a more porous film is likely to be formed, thus increasing the moisture permeability.

Comparison between Example 3 and Example 4 reveals that the increased magnetic flux density reduces the discharge voltage required for the sputtering deposition, increases the moisture permeability of the anti-reflection layer, and reduces the arithmetic mean roughness Ra. Comparison between Example 4 and Example 5 reveals that deposition of the oxide thin-film in oxidization region leads to decreased moisture permeability and reduction in arithmetic mean roughness Ra of the anti-reflection layer.

Comparison between Comparative Example 1 and Comparative Example 2 and comparison between Example 5 and Comparative Example 3 reveal that there is a tendency to increase the moisture permeability of the anti-reflection layer, as the pressure for the bombardment treatment of the substrate is increased. As described above, the arithmetic mean roughness of the substrate surface tends to be increased by the bombardment treatment, and it is believed that the columnar growth of the sputtered film due to the irregularities formed on the surface by the bombardment treatment makes a contribution to the increase in moisture permeability.

In Comparative Example 1 in which the anti-reflection layer with the low moisture permeability was formed by reducing the sputtering deposition pressure, unevenness was observed, as shown in FIG. 3, in the polarizing plate after the heating test. On the other hand, no difference in appearance was observed between before and after the heating test in Examples 1 to 5 in which the highly moisture-permeable anti-reflection layers were formed, as well as in Comparative Example 5 in which the anti-reflection layer was formed by the vacuum deposition method and Comparative Examples 6 and 7 in which the anti-reflection layers were formed by wet coating. These results reveal that the increased moisture permeability of the anti-reflection layer improves the heating durability of the anti-reflection layer-equipped polarizing plate.

In Comparative Example 5 in which the anti-reflection layer was formed by the vacuum deposition method, the heating durability of the polarizing plate was favorable because of the high moisture permeability of the anti-reflection layer, while the scratch resistance was insufficient because of the insufficient mechanical strength of the film. In Comparative Examples 6 and 7 in which the anti-reflection layers were formed by wet coating, the mechanical strength of the anti-reflection layers was further lower than that of Comparative Example 5.

Comparison between Comparative Example 6 and Comparative Example 7 reveals that in Comparative Example 7 in which the surface irregularity of the substrate was increased by the bombardment treatment, the arithmetic mean roughness of the anti-reflection layer disposed thereon was increased, and the fingerprint wiping-off property was decreased. The surfaces of the anti-reflection films according to Examples 1 to 5 all have arithmetic mean roughness Ra equal to that of Comparative Example 6 or smaller than that of Comparative Example 6, and thus have favorable fingerprint wiping-off properties.

From the foregoing results, it is determined that through the adjustment of conditions for the sputtering deposition, an anti-reflection layer with high moisture permeability and high mechanical strength is formed, thereby providing an anti-reflection film which is excellent in polarizing plate reliability at high temperature and mechanical strength. In addition, in a case where the anti-reflection film surface has small arithmetic mean roughness Ra, the fingerprint wiping-off property is improved. From the comparison between Examples 1 to 5 and Comparative Examples 1 to 4 mentioned above, the preferable conditions for manufacturing the anti-reflection film which has all of the mechanical strength, the heating durability of the polarizing plate due to high moisture permeability, and the fingerprint wiping-off property based on the surface profile include: adjustment of the surface profile of the substrate by plasma treatment (bombardment treatment) or the like; high magnetic-field deposition; high-pressure deposition to the extent that the surface irregularity is not excessively increased; and deposition in the transition region by oxygen flow control.

DESCRIPTION OF REFERENCE SIGNS

1 Transparent film substrate
10 Transparent film
11 Hard coat layer
3 Adhesion improvement layer
5 Anti-reflection layer
51, 52, 53, 54 Thin-film
7 Antifouling layer
8 Polarizer
9 Transparent film
100 Anti-reflection film
110 Anti-reflection layer-equipped polarizing plate

The invention claimed is:

1. An anti-reflection film comprising:
a transparent film substrate; and
an anti-reflection layer disposed on one principal surface of the transparent film substrate, the anti-reflection layer being composed of multilayer thin-films having different refractive indexes, wherein
the anti-reflection film has a moisture permeability of 15 to 1000 g/m²·24h,
an indentation elastic modulus of a surface of the anti-reflection layer is 20 to 100 GPa, and
an arithmetic mean roughness Ra of the surface of the anti-reflection layer is 1.3 nm or less.

2. The anti-reflection film according to claim 1, wherein the transparent film substrate includes a hard coat layer on a surface on which the anti-reflection layer is disposed.

3. The anti-reflection film according to claim 2, wherein the hard coat layer includes an acrylic urethane resin.

4. The anti-reflection film according to claim 2, wherein the hard coat layer is an anti-glare hard coat layer in which fine particles are dispersed in a resin matrix.

5. The anti-reflection film according to claim 1, further comprising an antifouling layer on a surface of the anti-reflection layer.

6. The anti-reflection film according to claim 1, wherein the anti-reflection layer is an alternative stack of a niobium oxide thin-film and a silicon oxide thin-film.

7. An anti-reflection layer-equipped polarizing plate comprising: a polarizer; and the anti-reflection film according to claim 1 disposed on one surface of the polarizer.

8. A method for manufacturing an anti-reflection film defined in claim 1, wherein at least one of the thin-films constituting the anti-reflection layer is deposited by a sputtering method.

9. The method according to claim 8, wherein a pressure in sputtering deposition of at least one of the thin-films constituting the anti-reflection layer is 0.4 Pa or higher.

10. The method according to claim 8, wherein at least one of the thin-films constituting the anti-reflection layer are deposited by a reactive sputtering during which an inert gas and a reactive gas are introduced into a deposition chamber.

11. The method according to claim 10, wherein an introduction amount of the reactive gas is controlled such that a deposition by the reactive sputtering is performed in a transition region.

12. The method according to claim 10, wherein a plasma emission intensity of discharge is sensed, and an introduction amount of the reactive gas is controlled based on the plasma emission intensity.

13. The method according to claim 10, wherein a discharge voltage is sensed, and an introduction amount of the reactive gas is controlled based on the discharge voltage.

14. The method according to claim 8, wherein a magnetic flux density at a target surface for sputtering deposition of at least one of the thin-films constituting the anti-reflection layer is 20 mT or higher.

15. The method according to claim 8, wherein each of the thin-films constituting the anti-reflection layer is deposited by a sputtering method.

* * * * *